(12) United States Patent
Li et al.

(10) Patent No.: US 10,939,553 B2
(45) Date of Patent: Mar. 2, 2021

(54) VERTICAL-SIDE SOLDER METHOD AND PACKAGE FOR POWER GAN DEVICES

(71) Applicants: Zhanming Li, West Vancouver (CA); Yan-Fei Liu, Kingston (CA); Yue Fu, Coquitlam (CA); Wai Tung Ng, Thornhill (CA)

(72) Inventors: Zhanming Li, West Vancouver (CA); Yan-Fei Liu, Kingston (CA); Yue Fu, Coquitlam (CA); Wai Tung Ng, Thornhill (CA)

(*) Notice: Subject to any disclaimer, the term of this patent is extended or adjusted under 35 U.S.C. 154(b) by 0 days.

(21) Appl. No.: 16/254,296

(22) Filed: Jan. 22, 2019

(65) Prior Publication Data
US 2019/0246499 A1 Aug. 8, 2019

Related U.S. Application Data

(60) Provisional application No. 62/626,005, filed on Feb. 3, 2018.

(51) Int. Cl.
| | | |
|---|---|---|
| H01L 27/18 | (2006.01) | |
| H05K 1/18 | (2006.01) | |
| H01L 23/31 | (2006.01) | |
| H01L 23/34 | (2006.01) | |
| H01L 29/20 | (2006.01) | |
| H01L 29/778 | (2006.01) | |
| H05K 1/02 | (2006.01) | |
| H05K 1/11 | (2006.01) | |

(52) U.S. Cl.
CPC ......... *H05K 1/181* (2013.01); *H01L 23/3171* (2013.01); *H01L 23/34* (2013.01); *H01L 29/2003* (2013.01); *H01L 29/778* (2013.01); *H05K 1/0203* (2013.01); *H05K 1/111* (2013.01); *H05K 2201/10166* (2013.01); *H05K 2201/10719* (2013.01); *H05K 2201/10734* (2013.01)

(58) Field of Classification Search
None
See application file for complete search history.

(56) References Cited

U.S. PATENT DOCUMENTS

2018/0102470 A1* 4/2018 Das .................... H01L 23/5385

* cited by examiner

*Primary Examiner* — Joseph C. Nicely
*Assistant Examiner* — Lamont B Koo

(57) ABSTRACT

A packaged GaN semiconductor device with improved heat dissipation is provided. A GaN device is packaged on a printed circuit board (PCB) with a vertical side of the device, and optionally the back side of the device, in thermal contact with the PCB. The packaging is compatible with surface mount technologies such as land grid array (LGA), ball grid array (BGA), and other formats. Thermal contact between the PCB and a vertical side of the device, and optionally the back side of the device, is made through solder. The solder used for the thermal contact may also connect a source terminal of the device, which also improves electrical stability of the device. The packaging is particularly suitable for GaN HEMT devices.

16 Claims, 13 Drawing Sheets

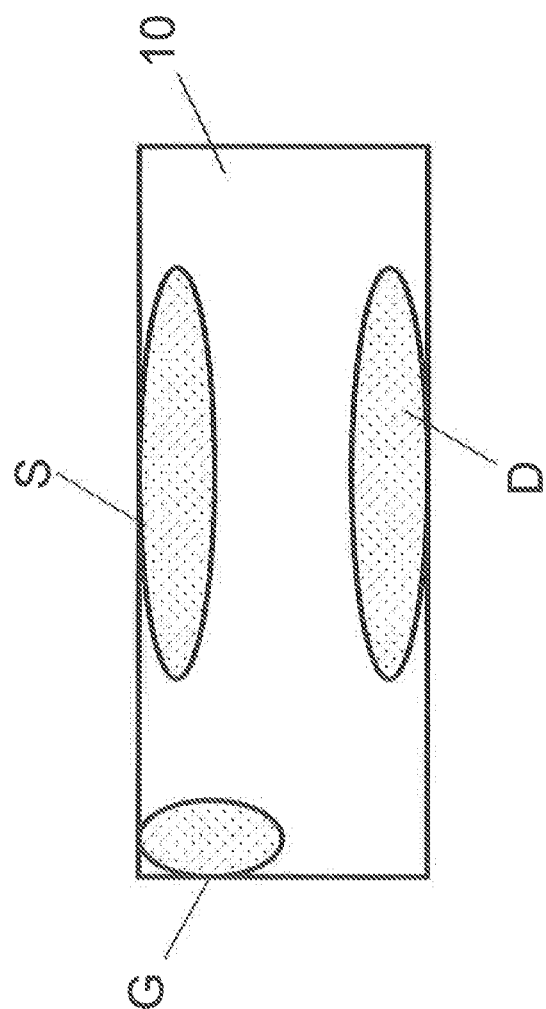
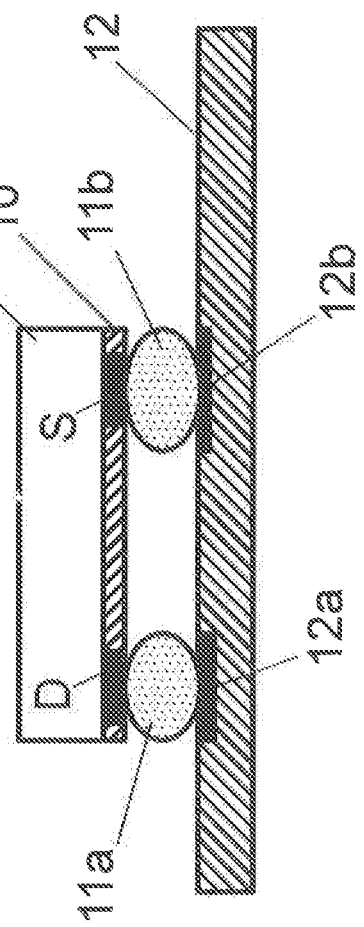
Fig. 1A (Prior Art)
Fig. 1B (Prior Art)

VERTICAL-SIDE SOLDER METHOD AND PACKAGE FOR POWER GAN DEVICES

RELATED APPLICATION

This application claims the benefit of the filing date of U.S. Application No. 62/626,005 filed on Feb. 3, 2018, the contents of which are incorporated herein by reference in their entirety.

FIELD

This invention relates to gallium nitride (GaN) power semiconductor devices and to GaN device packaging and assembling. More specifically, the invention relates to GaN device packaging and assembling that improves heat dissipation and electrical stability.

BACKGROUND

Gallium nitride (GaN) has emerged as the 3rd generation of semiconductor material to replace silicon and GaAs. With a Baliga figure of merit [1] of 3000 times of that of silicon, GaN has the potential to replace all existing silicon based power electronic devices. However, numerous technical barriers must be overcome for GaN to achieve wide adoption, one being to find an efficient and inexpensive method to package a GaN die and assemble the die on to the substrate and then to the PCB (printed circuit board).

For example, packaging of GaN switches is important for performance of power electronic devices. Reduction of parasitic inductance and thermal resistance depends on careful design of the packaging of a GaN switch. This is especially important for GaN devices since on-state resistance of GaN is more sensitive to temperature rise than that of a silicon device. Poorly designed packaging may cause damage to GaN power transistors due to overheating. Previously the land grid array (LGA) format has been one of the common formats for packaging. FIG. 1A is a diagram of a bottom view of a typical GaN power transistor 10, with solder pads for the gate, drain, and source (G, D, and S, respectively). Typically, the GaN device is built on a substrate such as a silicon wafer via process such as metalorganic chemical vapour deposition (MOCVD). FIG. 1B is a diagram of an end view of the GaN device 10 on a silicon substrate 14, in LGA format, showing solder bars 11a and 11b attached to the drain and source pads of the GaN device. After soldering to the metal traces 12a and 12b on the PCB 12, both electrical current and heat flux flow through the solder bars into the PCB. One advantage of the LGA package for GaN is the reduction of parasitic inductance and on-state resistance. A main drawback is that the only path for heat dissipation is via the solder bars into the PCB. Another disadvantage is that for thicker devices without good insulation, electrical charges can be trapped in the thick substrate (14 in FIG. 1B) which is located at the top of the device, the side furthest from the PCB, and may cause the substrate electrical potential to fluctuate and to disrupt the device operation. Therefore, it is very desirable to connect the thick substrate to a stable voltage potential.

To relieve such shortcomings, two prior approaches [2] have been used. FIG. 2 is a diagram of a side view of one prior approach, which uses epoxy encapsulation 24 over the HEMT device 20 and silicon substrate 24, which is soldered to the PCB 22 with solder bars 21a, 21b. The epoxy covers the complete HEMT device 20 and extends to the PCB 22, and is intended to provide an additional heat flow path around and over the back side of the GaN device. However, this approach has at least two problems. The thermal conductance of the epoxy is usually low, and it is an electrical insulating material that does not offer any substantial relief of back side electrical potential fluctuations due to undesirable charge being trapped in the substrate. The epoxy is normally used to protect the GaN die.

The other prior approach is based on the use of a metal heat sink on the back side of the LGA device. As shown in the diagram of FIG. 3, this approach requires a multi-step assembly procedure in which a thermal interface material 36 and heat sink 38 are applied to the back side of the silicon substrate 34 of GaN device 30, which is attached to metal traces 32a, 32b of a PCB 32 with solder bars 31a, 31b. The arrows show the directions of heat flow from the GaN device 30. The thermal performance of such a configuration is better than the approach using epoxy encapsulation, but at a substantial increase in assembly complexity and cost. Additional space on the PCB or with the device package is also required to accommodate the additional heat sink metal.

SUMMARY

According to one aspect of the invention there is provided an efficient and inexpensive method for enhancing heat dissipation of a GaN device.

According to another aspect of the invention there is provided an efficient and inexpensive method for packaging a GaN device, wherein the packaging enhances heat dissipation. In some embodiments, the packaging also enhances electrical stability of the GaN device.

According to another aspect of the invention there is provided a packaged GaN device, wherein the package enhances heat dissipation of the GaN device. In one embodiment a GaN device is packaged on a printed circuit board (PCB) with a vertical side of the device, and optionally the back side of the device, in thermal contact with the PCB. In some embodiments, the package also enhances electrical stability of the GaN device.

According to another aspect, there is provided a GaN HEMT packaged in LGA or BGA format that is soldered on the PCB, which comprises: a) contacts pads of source, drain, and gate; b) an exposed metal pad outside of the area covered by the GaN HEMT that is connected via PCB metal line to an array of source pads of the GaN HEMT; and c) the exposed metal pad of b) is soldered to the side of GaN HEMT. In one embodiment, the packaged GaN HEMT further comprises a backside being plated with metal to aid the adhesion of solder. In one embodiment, the packaged GaN HEMT further comprises side soldering metal that is above the height of the GaN HEMT and that adheres to the backside of the device.

According to another aspect, there is provided a semiconductor device packaged on a printed circuit board (PCB), comprising: metal contact pads disposed on a bottom side of the semiconductor device, wherein the bottom side of the semiconductor device substantially faces the PCB and the metal contact pads are soldered to respective metal traces of the PCB; at least one metal trace of the PCB that extends beyond an area of the PCB covered by the semiconductor device; wherein the at least one metal trace of the PCB is soldered to at least one of a vertical side and a back side of the semiconductor device.

In one embodiment, the at least one metal trace of the PCB is soldered to a vertical side and the back side of the semiconductor device.

In one embodiment, metal is disposed on the back side of the semiconductor device; wherein the metal on the back side is soldered to the at least one metal trace of the PCB.

According to another aspect there is provided a method for packaging a semiconductor device, comprising: providing a printed circuit board (PCB) having metal traces at locations corresponding to respective metal contact pads disposed on a bottom side of the semiconductor device, wherein at least one metal trace of the PCB extends beyond an area covered by the semiconductor device; soldering the metal contact pads of the semiconductor device to the respective metal traces on the PCB; and applying solder to the at least one metal trace of the PCB so that the solder contacts at least one of a vertical side and a back side of the semiconductor device.

In one embodiment, the method comprises applying solder to the at least one metal trace of the PCB so that the solder contacts a vertical side and the back side of the semiconductor device.

In one embodiment, the method comprises disposing metal on the back side of the semiconductor device.

In accordance with the aspects and embodiments, the semiconductor device may be a GaN semiconductor device. The GaN semiconductor device may be a HEMT device.

In some embodiments, the at least one metal trace of the PCB that is soldered to the at least one of a vertical side and back side of the semiconductor device may also be soldered to a source metal contact pad of the HEMT device.

In accordance with aspects and embodiments, the semiconductor device may be soldered to the PCB according to a surface mount technology. The surface mount technology may comprise a land grid array (LGA) format, a ball grid array (BGA) format, or a quad-flat no leads (QFN) format.

BRIEF DESCRIPTION OF THE DRAWINGS

For a better understanding of the invention, and to show more clearly how it may be carried into effect, embodiments will be described, by way of example, with reference to the accompanying drawings, wherein:

FIG. 1A is a schematic diagram showing a bottom view of a GaN power device (high electron mobility transistor (HEMT)), and FIG. 1B shows a side view of the GaN device soldered to a printed circuit board with LGA packaging, according to the prior art.

FIGS. 6A and 6B show the thermal simulation results for the reference structure of FIG. 5, wherein FIG. 6A shows the temperature distribution in degrees Kelvin, and the numbered lines (1 to 10) evenly divide the temperature distribution from the minimum to the maximum, and FIG. 6B shows heat flow vectors at steady state.

FIGS. 8A and 8B show thermal simulation results for the embodiment of FIG. 7, wherein FIG. 8A shows temperature distribution in degrees Kelvin, and FIG. 8B shows heat flow vectors at steady state.

FIGS. 10A and 10B show thermal simulation results for the embodiment of FIG. 9, wherein FIG. 10A shows temperature distribution in degrees Kelvin, and FIG. 10B shows heat flow vectors at steady state.

DETAILED DESCRIPTION OF EMBODIMENTS

Figure 2:
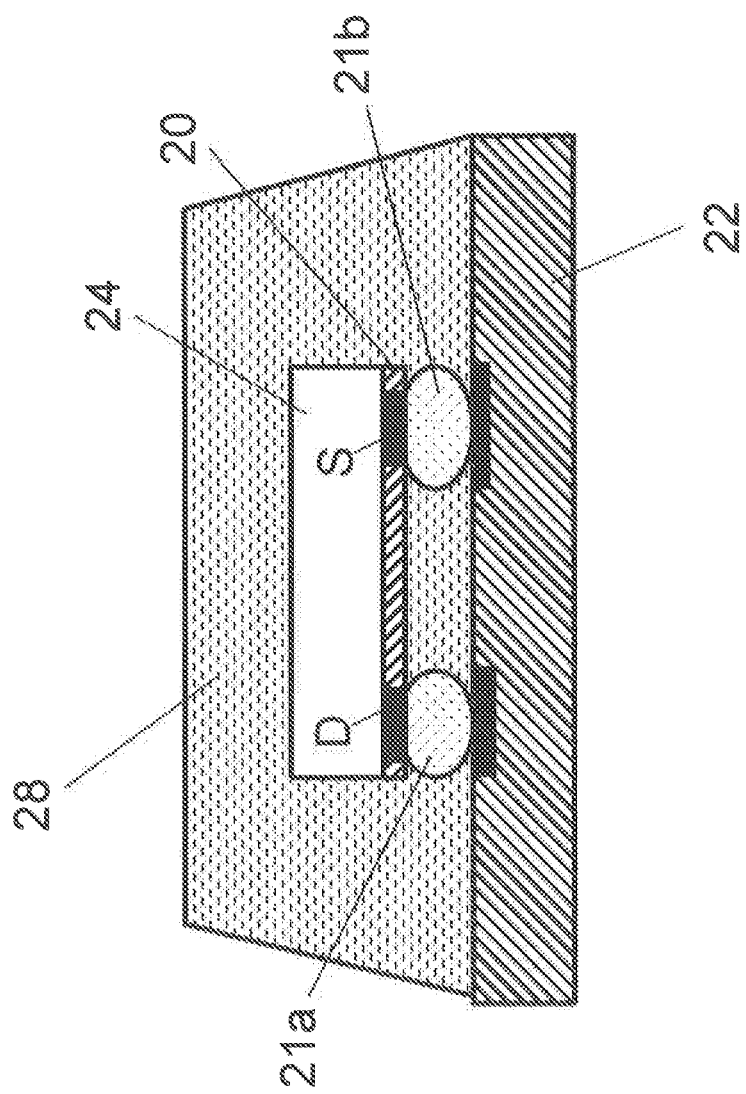
FIG. 2 is a schematic diagram showing a side view of packaged GaN HEMT using epoxy encapsulation, according to the prior art.
Figure 3:
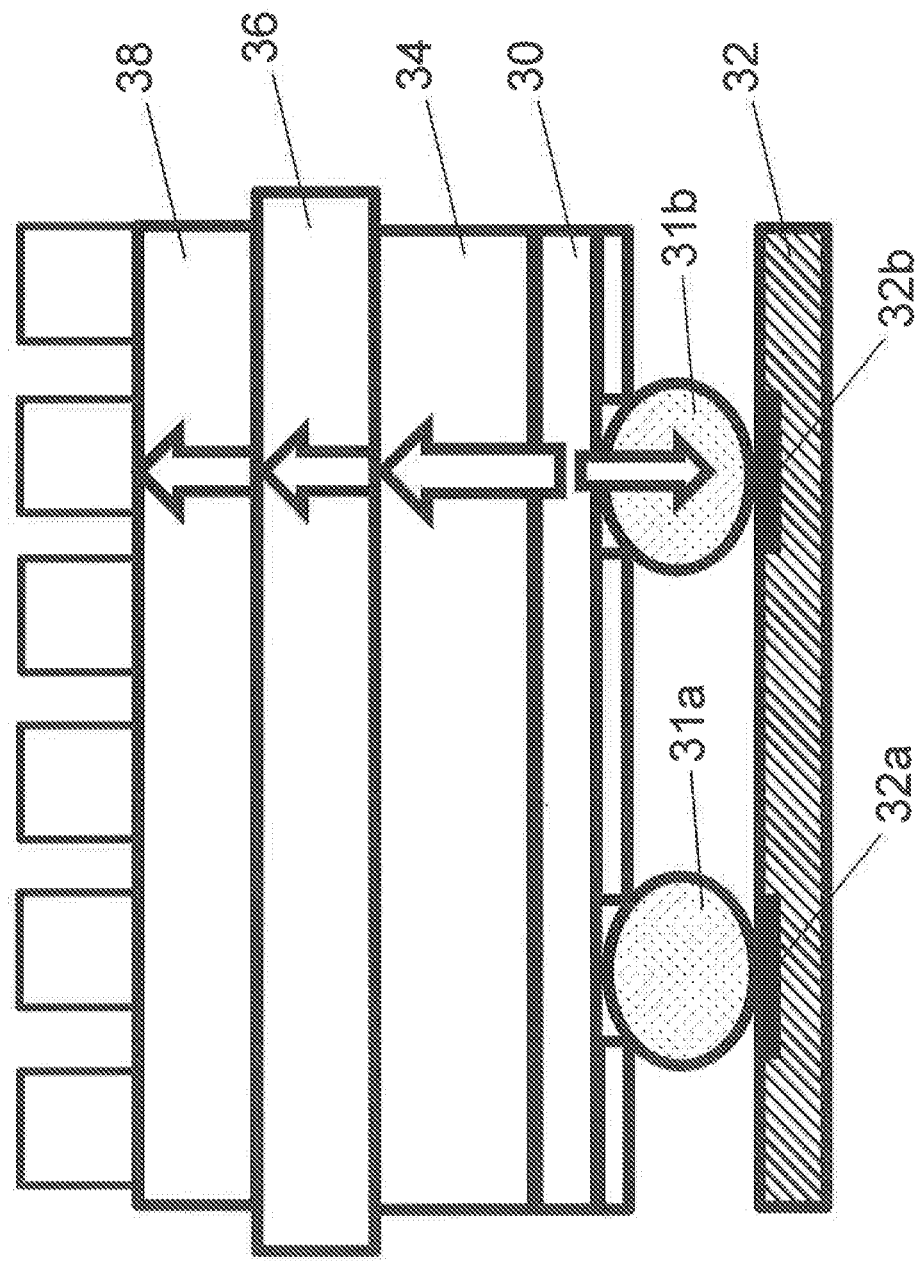
FIG. 3 is a schematic diagram showing a side view of a packaged GaN HEMT using a back side heat sink assembly, according to the prior art.

One aspect of the invention relates to packaging of GaN (gallium nitride) devices. The GaN devices may be lateral devices based on two-dimensional electronic gas (2DEG) technology. The GaN devices may be power transistors, such as high electron mobility transistors (HEMTs). The GaN material may be grown on silicon, sapphire, or silicon carbide (SiC) materials, using, e.g., a process such as metal-organic chemical vapour deposition (MOCVD). The methods and packaging embodiments described herein may be used with such GaN devices in conjunction with packaging formats such as land grid array (LGA) format, ball grid array (BGA) format, quad-flat no leads (QFN) format, and other surface mount technology (SMT). For efficiency, embodiments are described in respect of LGA format GaN silicon devices (i.e., GaN devices on silicon substrates); however, the invention is not limited thereto.

The 2DEG technology offers high electron mobility and thus superior switching performance, making it desirable in applications such as switching mode power supply. However, the 2DEG performance is more sensitive to temperature rise than its silicon counterpart, and thus it is necessary to provide heat dissipation when packaging and assembling such devices on a PCB to limit the temperature rise of the device.

To take advantage of the 2DEG technology, it is also necessary to design the transistor such that electrical current flows parallel to the PCB surface (i.e., a lateral device). This is different from its counterparts in silicon which are mostly vertical devices with current flowing vertical to the PCB (i.e., vertical device). Examples of common silicon power transistors include IGBT and VDMOS.

As used herein, the term "printed circuit board" (PCB) is intended to refer to any type of circuit board to which a semiconductor device may be soldered.

One result of using a lateral die structure is that the back side (or top side) of the device is left unattached, or floating. In other words, the back side of the die is not connected electrically to the gate, source, or drain terminal of the device. The gate, source, and drain terminals are all located at the bottom side of the die, as shown in FIG. 1A. Depending on the types of substrate material for the GaN device, an unattached or floating substrate (the back side) might attract undesirable electrical charges and might interfere with the electrical performance as well as block the outward flow of heat.

As used herein, the term "bottom side" is intended to refer to the side of a lateral device die that bears the semiconductor device in which current flows laterally. When such a device is mounted (i.e., soldered) to a PCB, the bottom side faces the PCB surface.

As used herein, the term "vertical side" is intended to refer to a side of a lateral device die that is substantially perpendicular to the bottom side. When such a device is mounted (i.e., soldered) to a PCB, a vertical side is substantially perpendicular to the PCB surface.

As used herein, the term "top side" or "back side" is intended to refer to the side of a lateral device die that opposes the bottom side. When such a device is mounted (i.e., soldered) to a PCB, the back side is substantially parallel or coplanar with the PCB surface. Typically, as noted above, a GaN device is grown on a silicon (or other material) substrate. Thus, the top side or back side of a GaN device typically includes the silicon or other material.

As described herein, heat dissipation of a GaN device is improved by providing a path for heat flow from the device to the PCB. According to one embodiment, the heat flow path is provided from a vertical side of the device to the PCB. In one embodiment, the heat flow path is provided by disposing solder on the vertical side of the GaN device, wherein the solder is also connected to a metal pad on the PCB. In another embodiment, the heat flow path is provided from a vertical side and the back side of the device to the PCB. In one embodiment, the heat flow path is provided by disposing solder on the vertical side and the back side of the GaN device, wherein the solder is also connected to a metal pad on the PCB. In some embodiments the metal pad on the PCB may be the source pad, i.e., the pad connected to the source of a device such as a HEMT. In some embodiments the solder may be disposed on the vertical side, or vertical side and back side of the device when the device is mounted to a PCB in a surface mount format such as LGA, BGA, QFN, etc. Thus, according to the embodiments an additional heat path is provided to allow some heat generated in the device to flow from back side and vertical side to the PCB through the solder.

In addition, in embodiments wherein solder is disposed on the back side of the device, the back side is also electrically connected to the source terminal, which is a stable voltage potential, and thus stabilizes the back side electrical potential. Therefore, such embodiments solve both problems mentioned above relating to devices such as GaN power HEMTs in LGA, or other SMT package formats. It is also noted that the embodiments are inexpensive to implement. Embodiments will be further described with reference to the drawings. In the embodiment shown in FIG. 4, solder bars 41a, 41b connect the source (S) and drain (D) of the GaN device 40 to the metal pads (or traces) 42a, 42b of a PCB 42 (the gate is not shown). The source pad 42b on the PCB 42 is extended beyond the device 40. The extra surface area of the source pad 42b is large enough to accommodate a substantial amount of solder 46, which contacts the vertical side of the GaN device 40, including the silicon substrate 44. The source pad 42b may be positioned so that solder easily contacts a selected vertical side of the device 40. In some embodiments the solder may also be applied to the back side of the GaN device, as shown at 46a, and over the vertical side of the GaN device, and then to the extended solder pad 42b on the PCB board 42. This provides a path for heat flow from the vertical and back side of the GaN device to the PCB.

Solder applied to the backside of the device will remain in place and contribute to heat removal even if there is no metal on the back side of the device. However, in some embodiments, all, or at least part of the back side of the GaN device may be plated with metal in order to improve the thermal performance, reduce the thermal resistance between the die and the surface, and improve solder adhesion. Plating the back side (e.g., the upper surface of the silicon substrate 44 in FIG. 4) will also further stabilize the back side electrical potential when solder is applied according to the embodiments.

In the embodiments, high thermal conductivity and good adhesion of the soldering material help extract heat from the GaN device, thus reducing the temperature rise of the device. In the embodiments, a standard solder used in SMT may be used, such as, for example, SAC105.

Figure 4:
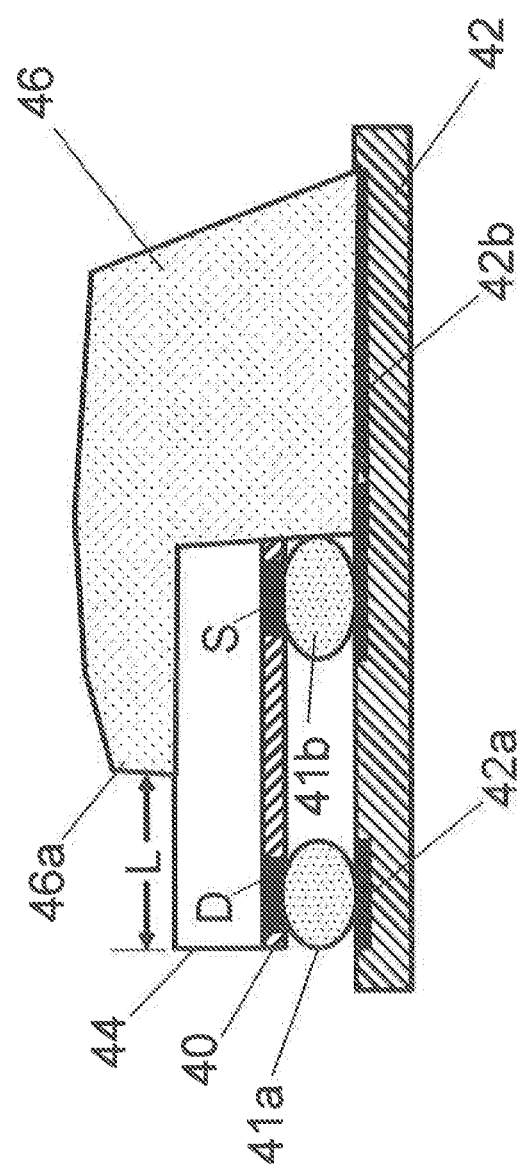
FIG. 4 is a schematic diagram showing a side view of a packaged GaN device, with both the vertical side and back side of the GaN device connected to the source soldering pad on a PCB through solder, according to one embodiment.

It is noted that in FIG. 4, the back side of the GaN device is only partially covered by solder, as shown at 46a. In a practical application, in order to achieve the best thermal performance, the larger the surface area of the device covered by the solder material, the better the thermal performance will be. The best thermal performance will be achieved by completely covering the back side of the GaN device with solder material. However, it is noted that when the back side is covered by solder material completely, the distance between the drain and source will be the height (i.e., thickness) of the GaN die. In some cases, the height is very small, such as 0.5 mm. Such a small distance between drain terminal and source terminal might cause a larger leakage current, and other performance drawbacks in a practical application. Therefore, a desired implementation strategy is to cover the back side with the solder material as much as possible and at the same time, leave a distance L between solder material and the edge (the left edge as shown in FIG. 4) of the back side. For example, L may be at least about equal to the thickness of the die, and up to about twice the thickness of the die. For example, L may be about 0.5 mm to about 1 mm. In some embodiments, one or more areas of the back side of the device may be selectively plated with metal to control the area(s) covered by solder. For example, an area related to L in FIG. 4 may not be plated to avoid solder in that area. Such embodiments ensure that proper performance of the device is maintained.

The source vertical side of the device (the right side in FIG. 4) should be connected to the solder substantially completely in order to improve the heat transfer performance. The wider the solder material, the better the heat transfer performance. Considering practical limitations and results of the simulation (presented below), the width of the solder may be similar to the width of the device, as shown in FIG. 4, as well as FIG. 7 and FIG. 9, to achieve good thermal performance.

Figure 5:
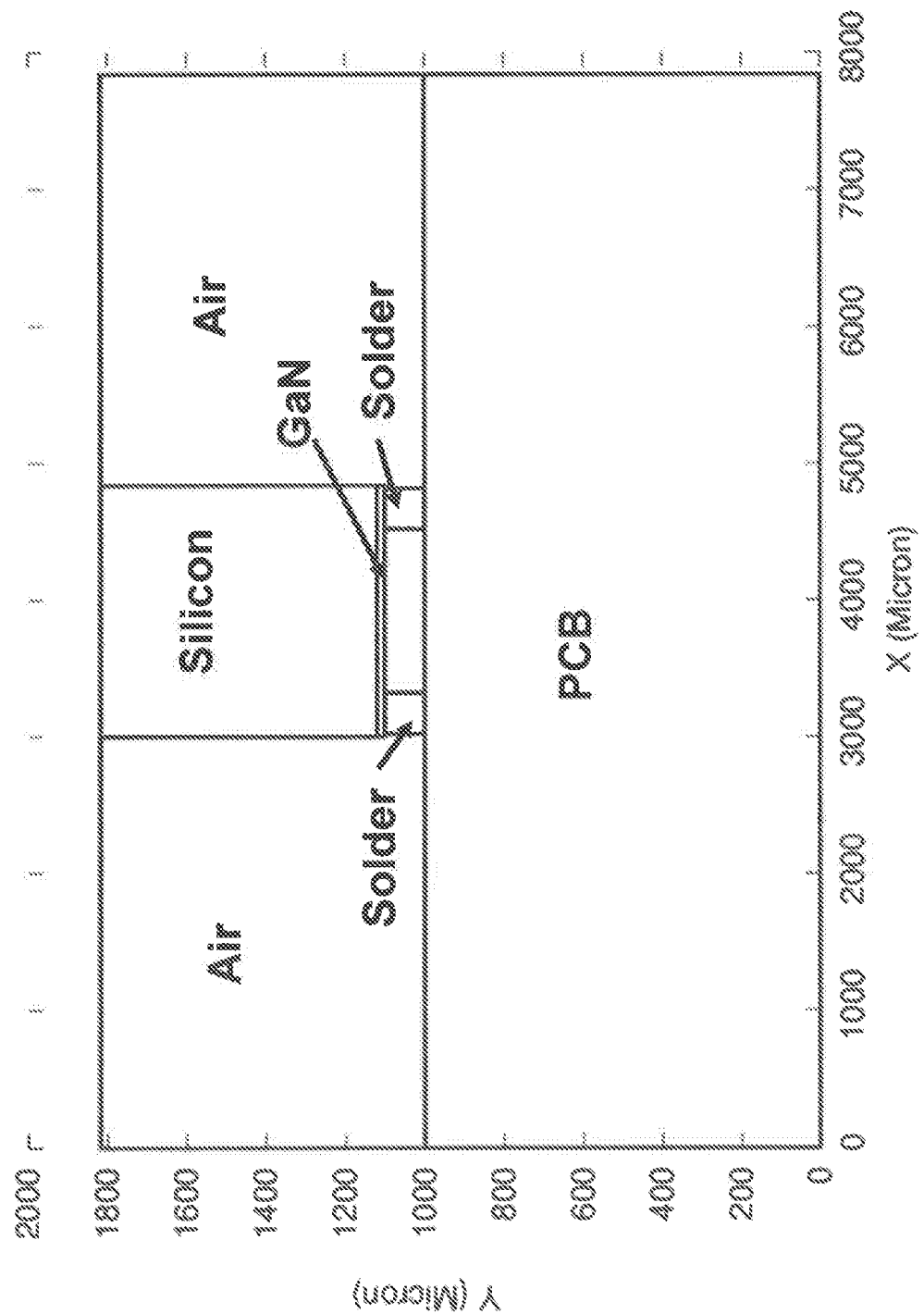
FIG. 5 is a diagram showing the structure and profile (in microns) of a reference prior LGA GaN device soldered on a PCB, for a two-dimensional thermal simulation.
Figure 6A:
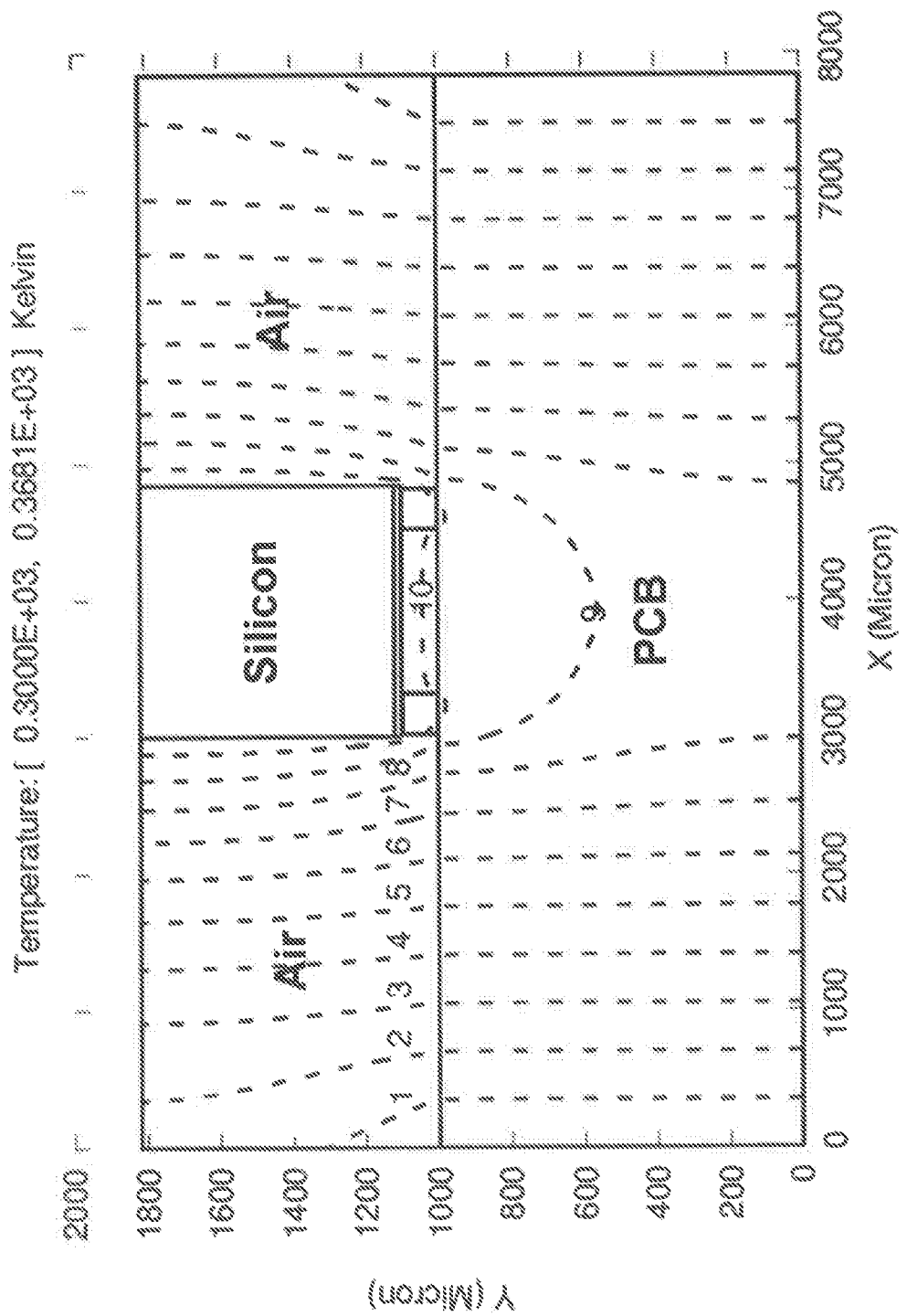
Figure 6B:
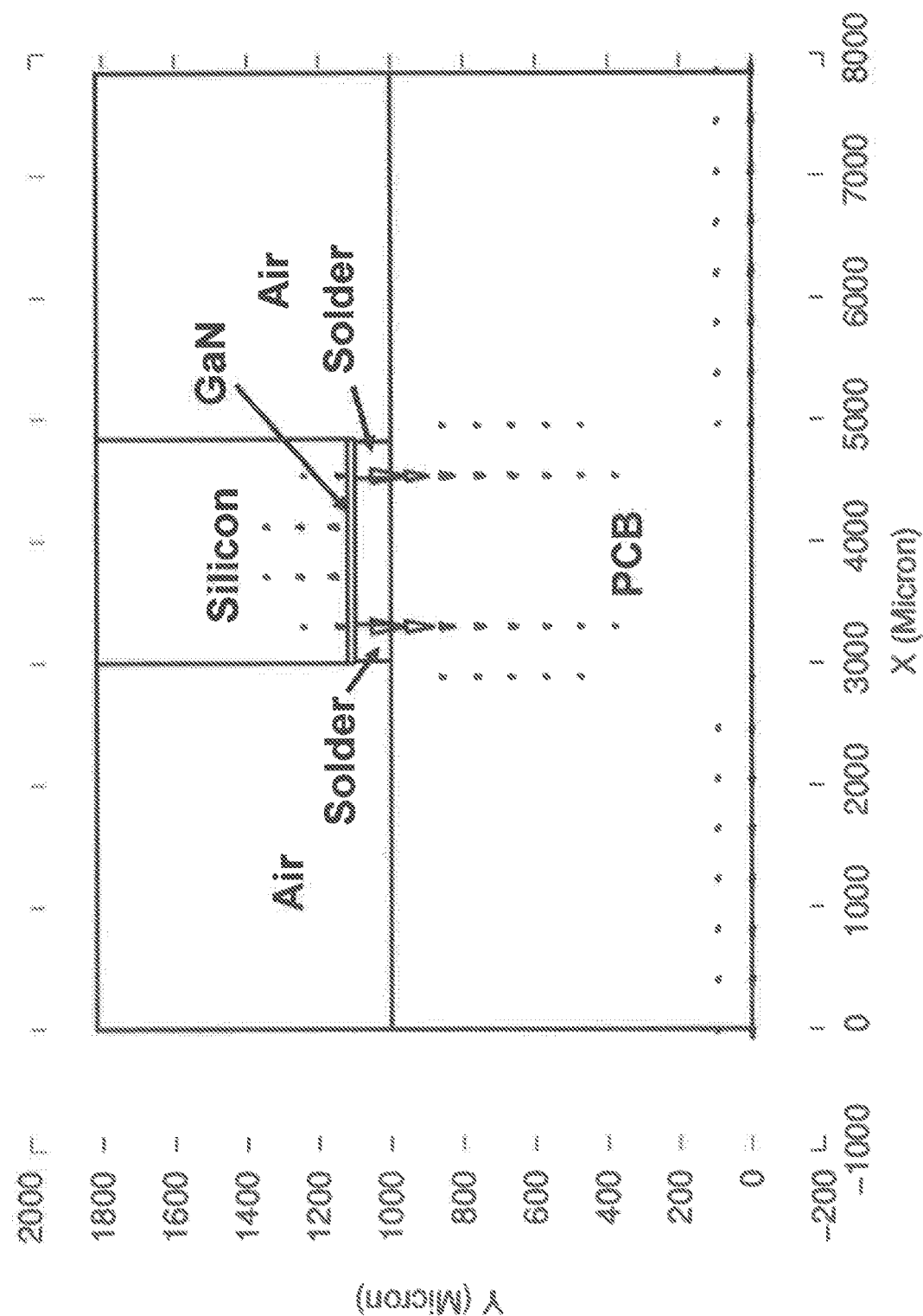

Two-dimensional thermal simulations were conducted using semiconductor device simulation software (APSYS, Crosslight Software Inc., Vancouver, Canada). First, the simulation was conducted on a reference prior LGA structure, shown in the diagram of FIG. 5. For simplicity, the PCB thermal conductivity was set as a fitting parameter to represent various thermal conditions such as solder interface thermal resistance and radiation heat conduction. The thermal boundary was such that a heat sink at 300 Kelvin was located on the left and right sides of the PCB, respectively. The PCB thermal conductivity was adjusted such that the maximum temperature rise was 68 degrees at 5 W heating power with the device depth being 4 mm (FIG. 6A). In other words, the maximum temperature was about 368 degrees Kelvin at room temperature of 300 degrees Kelvin. The heating source was placed near the AlGaN and GaN interface, which is close to the solder bumps of the LGA. The heat flow vectorial diagram shows heat conduction is mainly through the solder bumps that attach the GaN device to the PCB, as shown in FIG. 6B.

Figure 7:
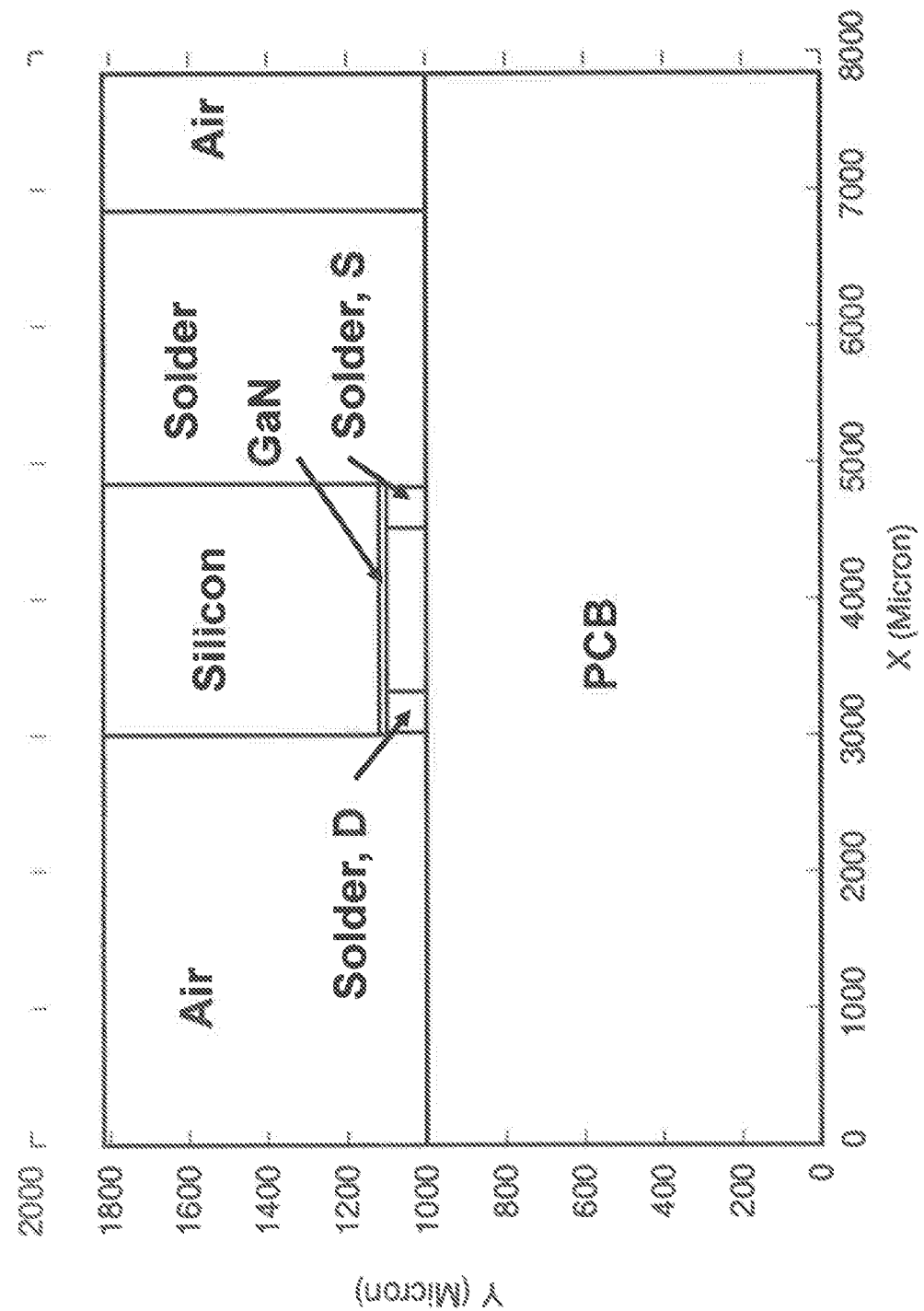
FIG. 7 is a diagram showing the structure and profile (in microns) of an LGA GaN device according to an embodiment with a vertical side of the device soldered to the source electrode pad on the PCB, used in a thermal simulation.
Figure 8A:
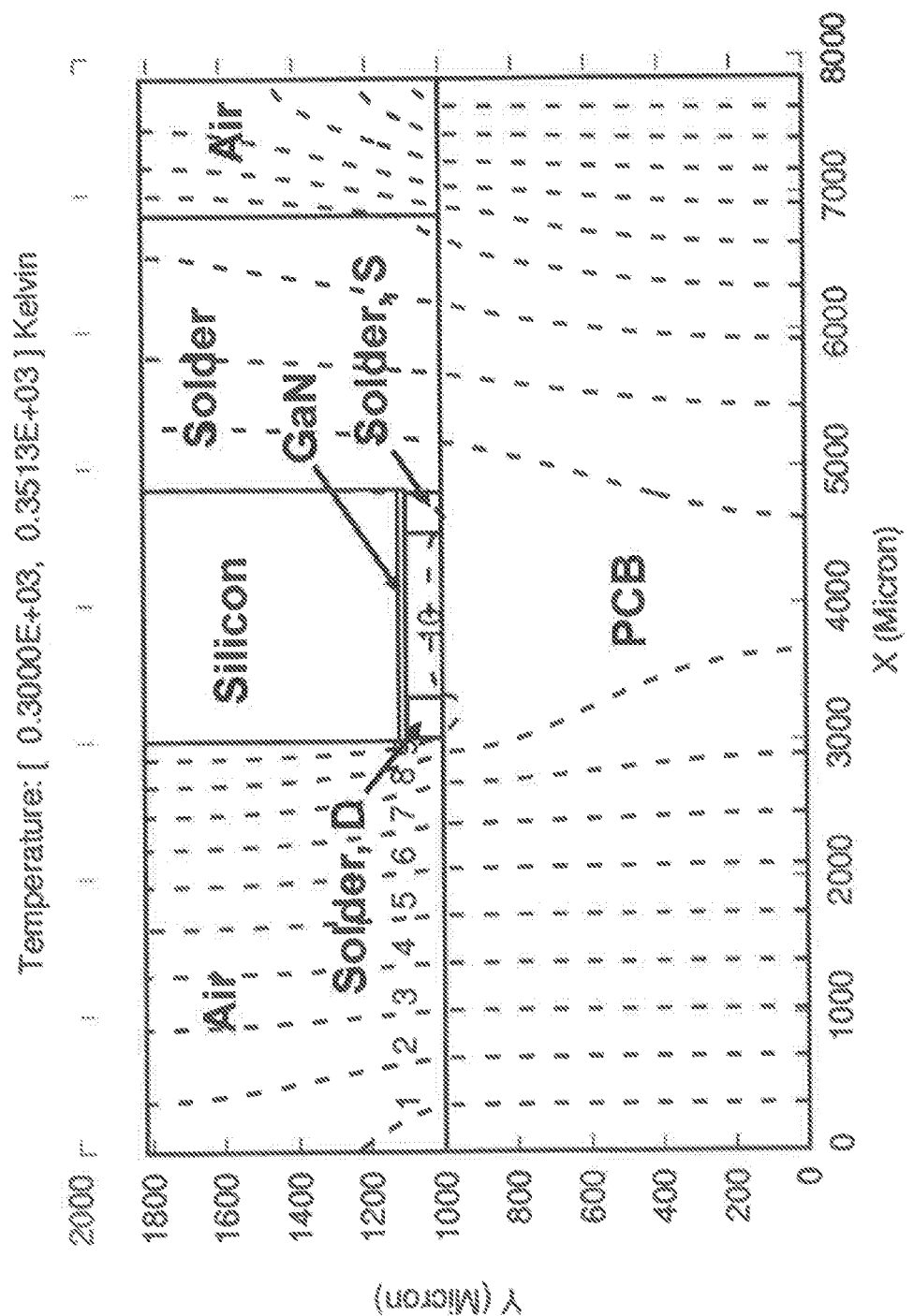
Figure 8B:
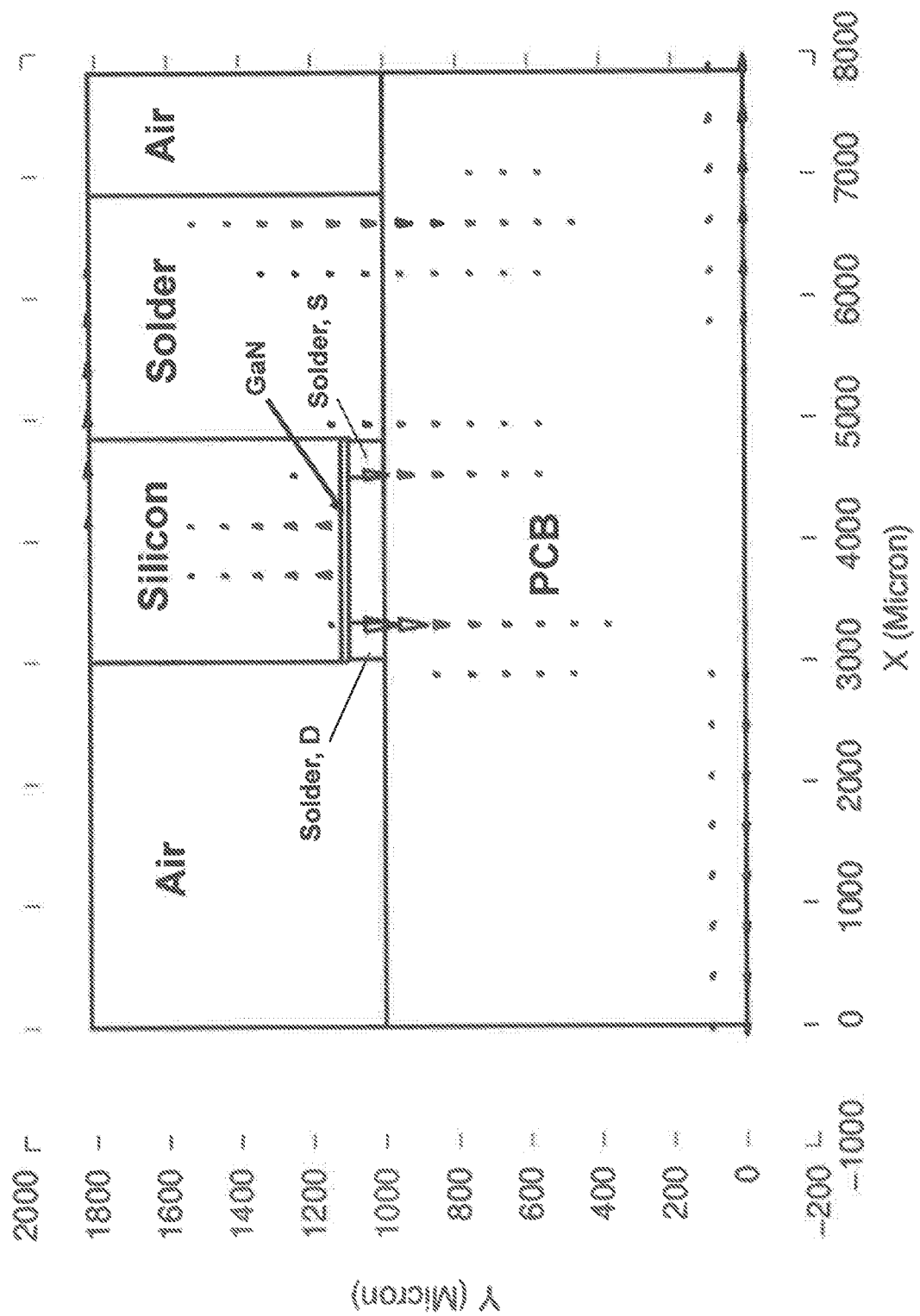

Next, the simulation was conducted on an embodiment with only vertical side soldering connected to the source pad on the PCB. The structure is shown in the diagram of FIG. 7, and simulation results are shown in FIGS. 8A and 8B. It was observed that the highest temperature was 351 degrees Kelvin, or a temperature rise of 51 degrees above room temperature of 300 degrees Kelvin. This shows that a temperature rise reduction of 17 (68-51) degrees was achieved with the embodiment, compared to the prior LGA structure of FIG. 5. This is because the heat flow was diverted to the vertical side of the GaN device and then flowed down to the PCB, as shown in the heat flow vectorial diagram of FIG. 8B.

Figure 9:
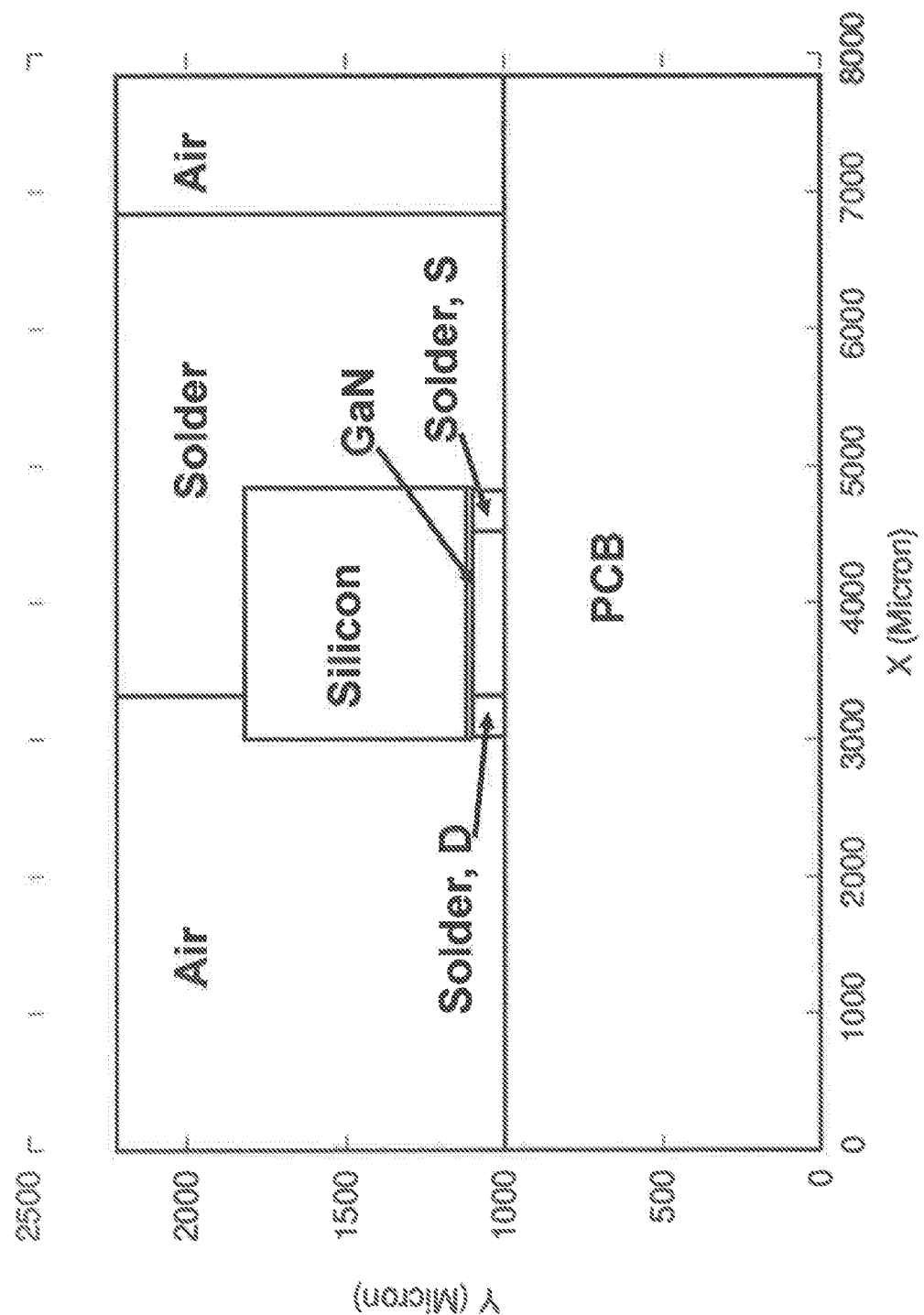
FIG. 9 is a diagram showing structure and profile (in microns) of an LGA GaN device according to an embodiment with a vertical side and back side the device soldered to the source electrode pad on the PCB, used in a thermal simulation.
Figure 10A:
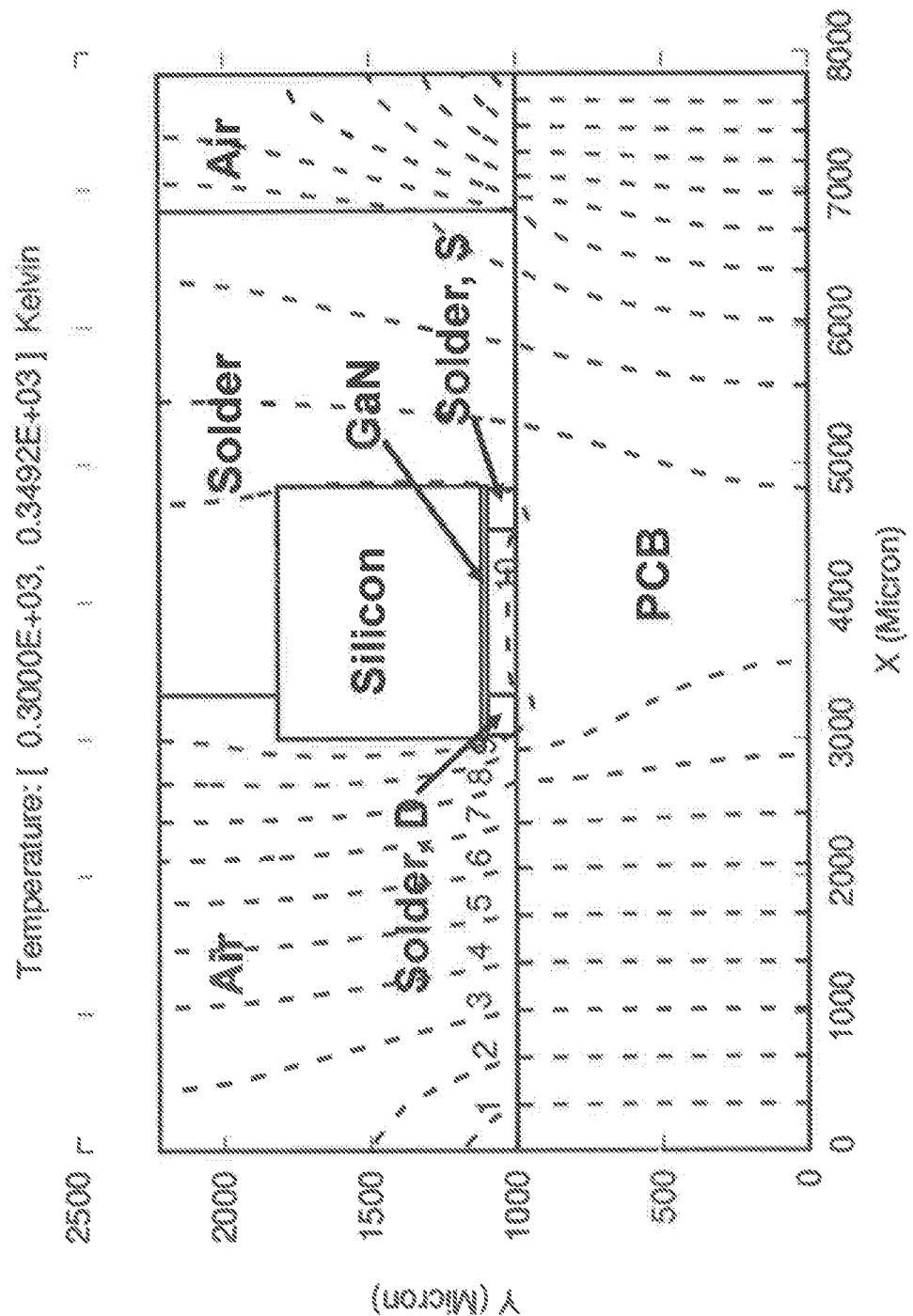
Figure 10B:
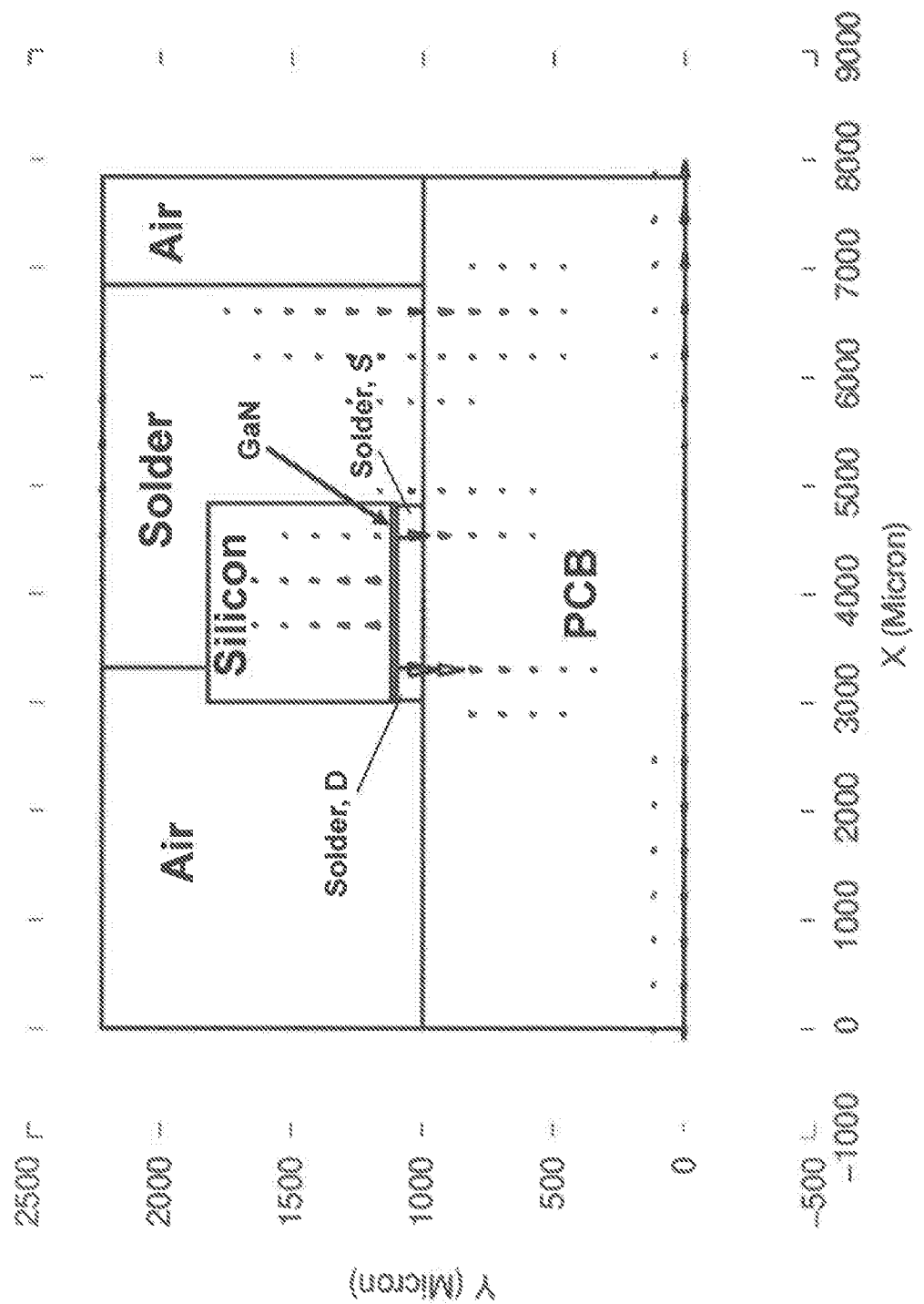

Finally, the simulation was conducted on an embodiment with both the top side and a vertical side of the GaN device are covered by solder, which is soldered to an extended S pad on the PCB. The structure is shown in the diagram of FIG. 9, and FIGS. 10A and 10B show the results. FIG. 10A shows that the maximum temperature for this embodiment was 349 degrees Kelvin, or a temperature rise of 49 degrees above room temperature of 300 degrees Kelvin. In this case, a temperature rise reduction of 19 degrees was achieved, as compared with the prior LGA structure of FIG. 5. As shown in the heat flow vectorial diagram of FIG. 10B, heat flows through the top side of the GaN device and then down to the PCB pad through the solder at the right (S) side.

The contents of all cited publications are incorporated herein by reference in their entirety.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

REFERENCES

[1] B J. Baliga, "Power semiconductor device figure of merit for high-frequency applications" IEEE Electron Device Letters, Volume 10, Issue 10, pp. 455-457, October 1989.
[2] Alex Lidow, "Transistor packaging: a thing of the past?" Planet Analog Online Journal, 2013, https://www.planetanalog.com/author.asp?section_id=3136&doc_id=560789

The invention claimed is:

1. A semiconductor device packaged on a printed circuit board (PCB), comprising:
   metal contact pads disposed on a bottom side of the semiconductor device, wherein the bottom side of the semiconductor device substantially faces the PCB and the metal contact pads are soldered to respective metal traces on a surface of the PCB;
   at least one metal trace of the PCB that extends beyond an area of the PCB covered by the semiconductor device;
   wherein the semiconductor device has a plurality of vertical sides that are substantially perpendicular to the bottom side and a back side that opposes the bottom side;
   wherein the at least one metal trace of the PCB is soldered to at least one side of the semiconductor device selected from said vertical sides and the back side.

2. The semiconductor device of claim 1, wherein the at least one metal trace of the PCB is soldered to said vertical sides and the back side of the semiconductor device.

3. The semiconductor device of claim 2, comprising a metal disposed on the back side of the semiconductor device;
   wherein the metal on the back side is soldered to the at least one metal trace of the PCB.

4. The semiconductor device of claim 1, wherein the semiconductor device is a GaN semiconductor device.

5. The semiconductor device of claim 4, wherein the GaN semiconductor device is a HEMT device.

6. The semiconductor device of claim 5, wherein the at least one metal trace of the PCB that is soldered to at least one side selected from said vertical sides and the back side of the semiconductor device is also soldered to a source metal contact pad of the HEMT device.

7. The semiconductor device of claim 1, wherein the semiconductor device is soldered to the PCB according to a surface mount technology.

8. The semiconductor device of claim 7, wherein the surface mount technology comprises a land grid array (LGA) format, a ball grid array (BGA) format, or a quad-flat no leads (QFN) format.

9. A method for packaging a semiconductor device, comprising:
   providing a printed circuit board (PCB) having metal traces on a PCB surface at locations corresponding to respective metal contact pads disposed on a bottom side of the semiconductor device, wherein at least one metal trace of the PCB extends beyond an area covered by the semiconductor device;
   wherein the semiconductor device has a plurality of vertical sides that are substantially perpendicular to the bottom side and a back side that opposes the bottom side;
   soldering the metal contact pads of the semiconductor device to the respective metal traces on the PCB;
   soldering the at least one metal trace of the PCB so that the solder contacts at least one side of the semiconductor device selected from said vertical sides and the back side.

10. The method of claim 9, comprising applying solder to soldering the at least one metal trace of the PCB so that the solder contacts said vertical sides and the back side of the semiconductor device.

11. The method of claim 9, comprising disposing a metal on the back side of the semiconductor device.

12. The method of claim 9, wherein the semiconductor device is a GaN semiconductor device.

13. The method of claim 12, wherein the GaN semiconductor device is a HEMT device.

14. The method of claim 13, wherein the at least one metal trace of the PCB that is soldered to the at least one side selected from said vertical sides and the back side of the semiconductor device corresponds to a source metal contact pad of the HEMT device.

15. The method of claim 9, comprising soldering the semiconductor device to the PCB according to a surface mount technology.

16. The method of claim 15, wherein the surface mount technology comprises a land grid array (LGA) format, a ball grid array (BGA) format, or a quad-flat no leads (QFN) format.

* * * * *